United States Patent
Tsai et al.

(10) Patent No.: US 6,417,099 B1
(45) Date of Patent: Jul. 9, 2002

(54) METHOD FOR CONTROLLING DOPANT DIFFUSION IN A PLUG-SHAPED DOPED POLYSILICON LAYER ON A SEMICONDUCTOR WAFER

(75) Inventors: Chung-Shih Tsai, Chiayi Hsien; Der-Tgyr Fan, Taipei Hsien; Chou-Shin Jou, Hsin-Chu; Tings Wang, Hsin-Chu Hsien, all of (TW)

(73) Assignee: Mosel Inc., Hsin-Chu (TW)

( * ) Notice: Subject to any disclaimer, the term of this patent is extended or adjusted under 35 U.S.C. 154(b) by 0 days.

(21) Appl. No.: 09/148,050

(22) Filed: Sep. 3, 1998

(30) Foreign Application Priority Data

Apr. 27, 1998 (TW) .......................................... 87106461

(51) Int. Cl.$^7$ ............................................. H07L 21/28
(52) U.S. Cl. ..................... 438/647; 438/565; 438/592; 438/657
(58) Field of Search ................................ 438/657, 565, 438/592, 647

(56) References Cited

U.S. PATENT DOCUMENTS 5,668,051 A * 9/1997 Chen et al. ................. 438/558
5,759,905 A * 6/1998 Pan et al. .................... 438/565
5,940,733 A * 8/1999 Beinglass et al. ........... 438/655
5,976,961 A * 11/1999 Jung et al. ................... 438/592

\* cited by examiner

Primary Examiner—Chandra Chaudhari
Assistant Examiner—Lisa Kilday
(74) Attorney, Agent, or Firm—Winston Hsu

(57) ABSTRACT

The present invention provides a method for controlling dopant density of a plug-shaped doped polysilicon layer formed within a plug-shaped recess to prevent the dopant contained in the plug-shaped doped polysilicon layer from diffusing into a conductive layer under the plug-shaped recess through a bottom side of the plug-shaped recess, the plug-shaped recess being formed within a dielectric layer which is positioned above the conductive layer, the method comprising: (1) forming an undoped silicon layer on the surface of the plug-shaped recess; (2) forming a doped polysilicon layer on top of the undoped silicon layer to fill the plug-shaped recess; and (3) performing a thermal treatment to the semiconductor wafer so as to make the doped poly-silicon layer interact with the undoped silicon layer inside the plug-shaped recess which forms a completely doped polysilicon layer within the plug-shaped recess.

6 Claims, 2 Drawing Sheets

METHOD FOR CONTROLLING DOPANT DIFFUSION IN A PLUG-SHAPED DOPED POLYSILICON LAYER ON A SEMICONDUCTOR WAFER

BACKGROUND OF THE INVENTION

1. Field of the Invention

The present invention provides a method for processing a doped polysilicon layer on a semiconductor wafer, and more particularly, to a method for manufacturing a doped polysilicon layer and controlling the dopant diffusion around the doped polysilicon layer.

2. Description of the Prior Art

In present semiconductor device manufacturing, DRAM (dynamic random access memory) is formed by groups of single transistor DRAM cells and each single transistor DRAM cell comprises a MOS (metal oxide semiconductor) transistor and a capacitor. Please refer to FIG. 1. FIG. 1 is a sketching diagram of a normal single transistor DRAM cell. The single transistor cell 10 comprises a P-type Si substrate 12, an NMOS transistor 14, a bit line 16 for transferring data, a word line 18 for connecting with other DRAM cells, and a capacitor 20 used for recalling data through the use of storage of charge. The NMOS transistor 14 further comprises a $P^+$ (phosphorus ion) doped source 22 and drain 24, and a gate 28 comprising a gate oxide 26 and polycide 27. The capacitor 20 is made of doped polysilicon with a complex, multi-level 3-D structure, comprises a field plate 21 and a storage node 19, and is in electrical contact with the drain 24 of the transistor 14 through its storage node 19.

The source 22, drain 24 and gate 28 of the NMOS transistor 14 are separately connected with the bit line 16, capacitor 20 and word line 18. Using the voltage signal of the word line 18, the gate 28 can function in determining whether the channel between the bit line 16 and the storage node 19 of the capacitor 20 can become a conducting region by controlling the switching of the channel between the source 22 and drain 24. It can also retrieve the read and write data within the DRAM cell 10 by storing the current of the bit line 16 into the capacitor 20 or feeding the faradic charges stored in the capacitor 20 back to the bit line 16. The bit of the DRAM cell 10 comprises a doped polysilicon layer 15 and a conducting layer 17 made of a $WSi_x$ silicide wherein the doped polysilicon layer 15 is further used as a bit line plug 23 for electrically connecting the source 22 of the transistor 14.

However, in the manufacturing process or during practical operation for the DRAM cell 10, the dopants will undergo thermal diffusion both in the doped polysilicon layer 15 and source region 22. The thermal diffusion will induce the doping region of the source 22 to expand and then diminish the $L_{eff}$ (effective channel length) between the source region 22 and drain region 24 as well as give rise to hot electron effects that will induce electrical breakdown. These conditions will reduce the threshold voltage between the source region 22 and drain region 24, and generate small leakage currents and errors.

Hence the present invention provides a method for controlling the dopant density of the plug-shaped doped polysilicon layer and preventing dopant diffusion to other contact regions to solve those mentioned above problems.

SUMMARY OF THE INVENTION

It is therefore a primary objective of the present invention to provide a method for controlling the dopant density of the plug-shaped doped polysilicon layer and preventing the dopants diffusing to other contact regions to solve those mentioned above problems.

In a preferred embodiment, a plug-shaped doped polysilicon layer within a plug-shaped recess is formed within a dielectric layer which is positioned above the conductive layer wherein the method for controlling the dopant contained within the plug-shaped doped polysilicon layer from diffusing into a conductive layer under the plug-shaped recess through a bottom side of the plug-shaped recess comprises the following steps:

(1). forming an undoped silicon layer on the surface of the plug-shaped recess;

(2). forming a doped polysilicon layer on top of the undoped silicon layer to fill the plug-shaped recess; and (3). performing a thermal treatment on the semiconductor wafer so as to make the doped poly-silicon layer interact with the undoped silicon layer inside the plug-shaped recess to form a completely doped polysilicon layer within the plug-shaped recess.

It is an advantage of the present invention that the dopant density of the plug-shaped doped polysilicon layer is carefully controlled which prevents the dopants from diffusing to other contact regions.

This and other objectives and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 2:
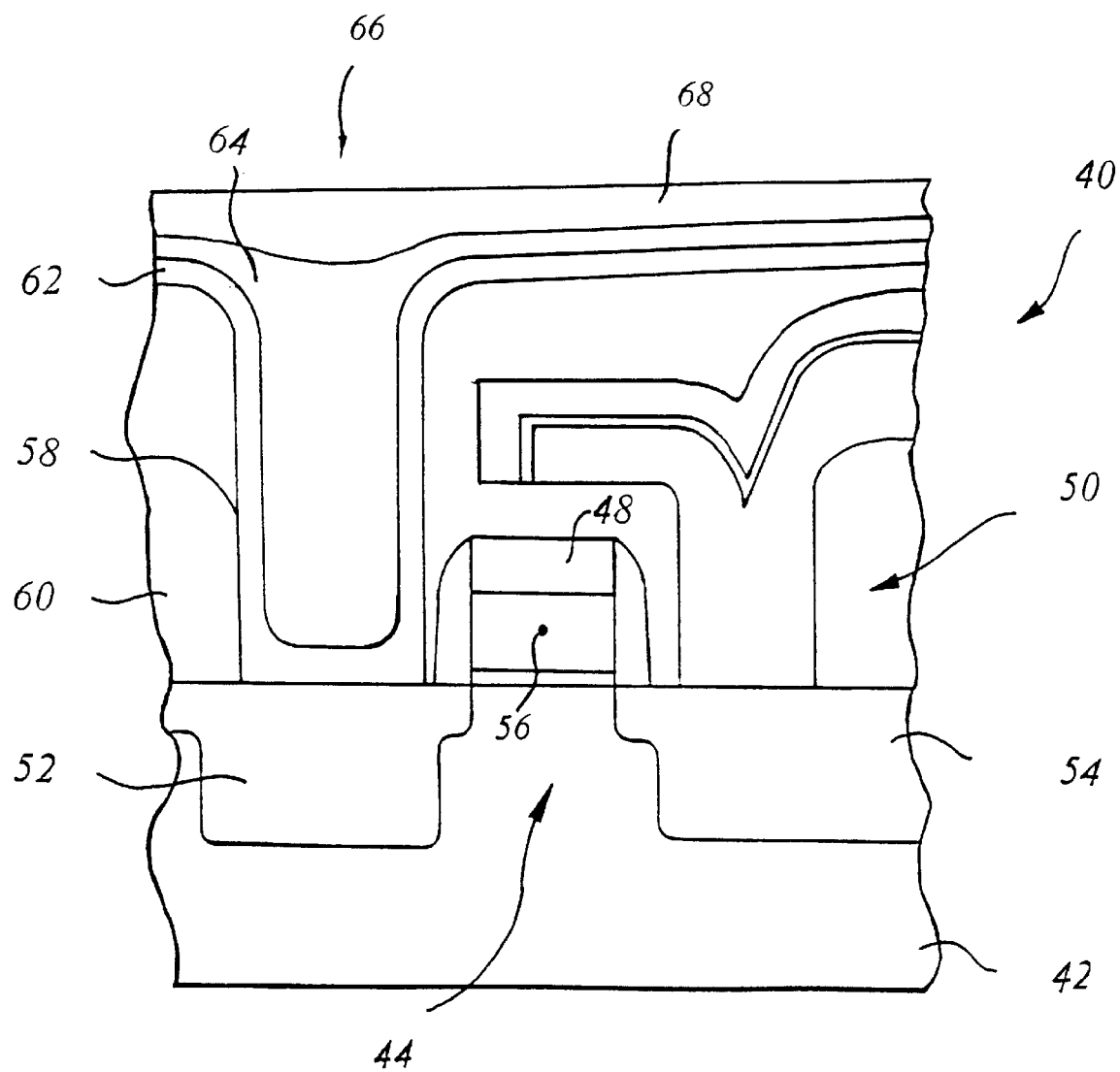
FIG. 2 is a sketching diagram of a single transistor DRAM cell according to the present invention.

Please refer to FIG. 2. FIG. 2 is a sketching diagram of a single transistor DRAM cell 40 according to the present invention. The DRAM cell 40 resembles the prior art DRAM cell 10 comprising a P-type Si substrate 42, a NMOS transistor 44 comprising a source region 52, drain region 54 and a polycide gate 56, a bit line 66 for electrically connecting to a source region 52 of the transistor 44, a word line 48 for electrically connecting to the gate 56 of the transistor 44, and a capacitor 50 for storing data and electrically connecting to the drain region 54 of the transistor 44.

Furthermore, the bit line 66 is installed inside the plug-shaped recess 58, and the sides of the plug-shaped recess 58 are adjacent to a dielectric layer 60 and the bottom of the plug-shaped recess 58 is in contact with the source 52 region of the transistor 44. Herein is a detailed description of the bit line plug with doped polysilicon of the present invention according to its practical procedure, and the method includes the following steps:

Step 1: Depositing an undoped polysilicon layer 62 onto the surface of the groove 58;

Step 2: Directly introducing a saturated steam of phosphorus into the deposited chamber and depositing a doped polysilicon layer 64 onto the undoped polysilicon layer 62 of the groove 58;

Step 3: At high temperatures, depositing a $WSi_x$ silicide 68 over the doped polysilicon layer 64 to enhance conduction of the bit line 66, and making the doped polysilicon layer 64 and the undoped polysilicon layer 62 interact to form an integrated doped polysilicon layer.

In step 3 or a post-process with a thermal treatment, the phosphorous dopants of the doped polysilicon layer 64 can diffuse into the undoped polysilicon layer 62 to form an integrated doped polysilicon layer. Thus, the undoped polysilicon layer 62 has no influence on the conduction in the bit line 66. In order to reduce the resistance of the final doped polysilicon layer inside the plug-shaped recess 58, an adequate amount of dopant needs to be maintained which can be achieved by maintaining an optimal ratio of the doped polysilicon layer 64 and the undoped polysilicon layer 62 of 1:1 to 1:4. The undoped polysilicon layer 62 is, in effect, a temporary layer that can be replaced with an amorphous silicon to form the undoped silicon layer at a lower reaction temperature (<575° C.). The amorphous silicon layer also interacts with the doped silicon layer 64 in a post thermal reaction to form an integrated doped polysilicon layer.

Under high temperature conditions, if a large amount of phosphorus dopant is doped into the plug-shaped recess 58, there may be excessive diffusion into the source region 52 of the transistor 40 causing an expansion of the source region 52. If, however, a small amount of phosphorus dopant is doped into the plug-shaped recess 58, there may be higher resistance which can ultimately influence the conduction within the bit line 66. These points are noteworthy as the density of the phosphorus dopant in the doped polysilicon layer of the prior art is not clearly quantified.

A key feature of the present invention is that by controlling the proportion of the doped polysilicon layer 64 and the undoped polysilicon layer 62, the ultimate density of the doped phosphorus in the plug-shaped recess 58 is also controlled. In a post-thermal process, phosphorus dopants in the doped polysilicon layer 64 will diffuse into the undoped polysilicon layer 62 to form an integrated doped polysilicon layer with the desired quantity of doped phosphorus thus accurately controlling the doping density of the final doped polysilicon layer and improving the bit line plug.

Since the principal function of the phosphorus dopants doped into the doped polysilicon layer inside the groove 58 is to reduce the resistance of the doped polysilicon layer under the silicide 68, the phosphorus dopant can be replaced with other doping elements from group IIIA or group VA of the periodic table. In this embodiment, phosphorus ions are employed as a doping source because it can form a P-type semiconductor (with predominantly positive charge carriers) and its conducting velocity is faster than an N-type semiconductor (with predominantly negative charge carriers). In addition, phosphorus has a lower cost, is more easily procured, and has a lower saturated steam and lower toxicity than arsenic and other related elements.

Figure 1:
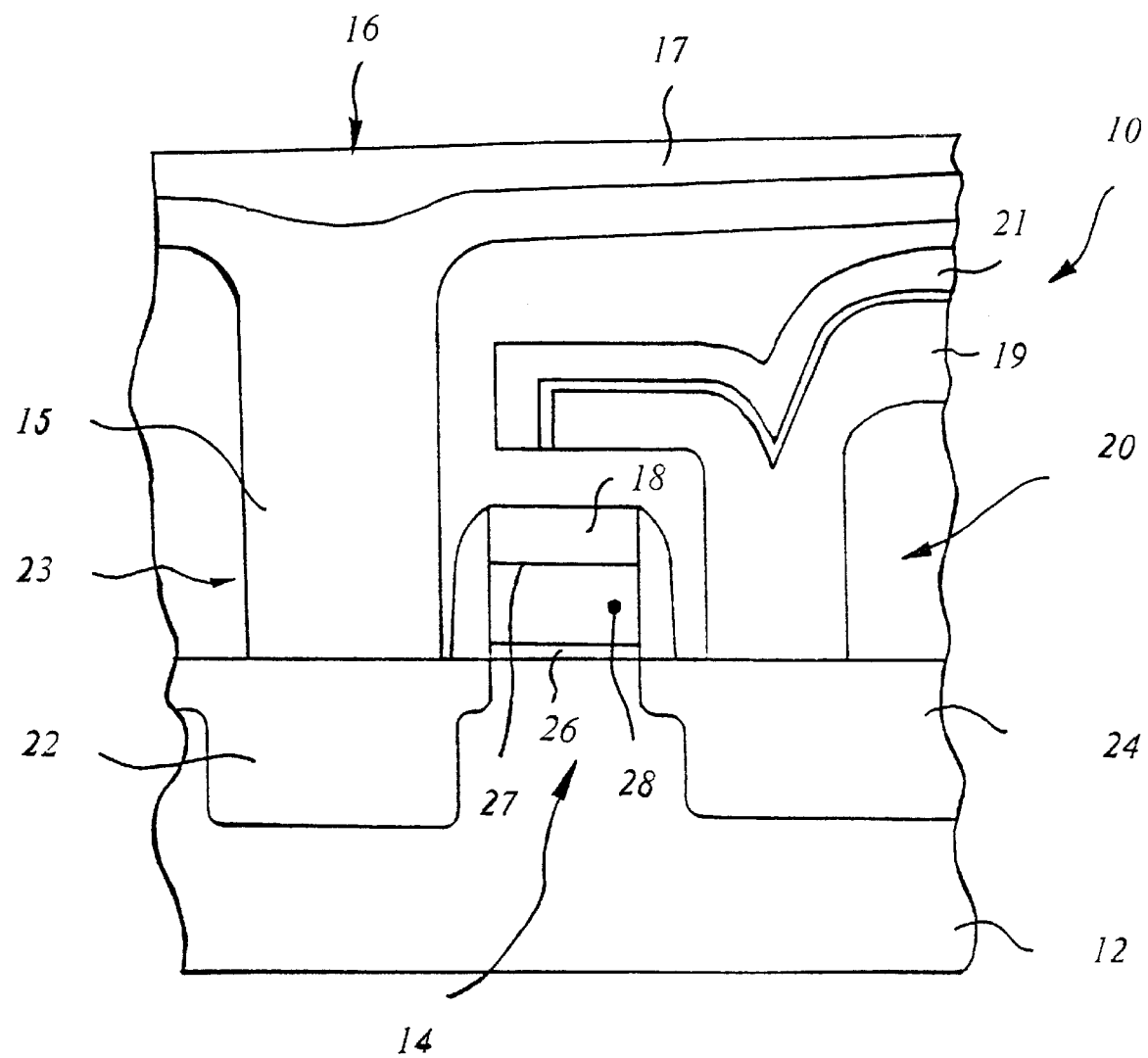
FIG. 1 is a sketching diagram of a normal single transistor DRAM cell.

The method of the present invention can further solve the problem of contact diffusion in the doped polysilicon plug. For example, the capacitor 20 shown in FIG. 1 has a similar plug-shape structure so it can utilize the method of the present invention for controlling the density of the dopants to prevent the dopant from diffusing into the drain 24 region of the transistor 14.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method for controlling dopant density of a plug-shaped doped polysilicon layer formed within a plug-shaped recess to prevent the dopant contained in the plug-shaped doped polysilicon layer from diffusing into a conductive layer under the plug-shaped recess through a bottom side of the plug-shaped recess, the plug-shaped recess being formed within a dielectric layer which is positioned above the conductive layer, the method comprising:

(1) forming an undoped silicon layer on the surface of the plug-shaped recess;

(2) forming a doped polysilicon layer on top of the undoped silicon layer to fill the plug-shaped recess; and (3) performing a thermal treatment to the semiconductor wafer so as to make the dopants in the doped polysilicon layer diffuse into the undoped silicon layer inside the plug-shaped recess;

wherein the volumes of the doped polysilicon layer and the undoped silicon layer inside the plug-shaped recess has an optimal ratio in the range of 1:1 to 4:1.

2. The method of claim 1 wherein the undoped polysilicon layer is made of undoped polysilicon.

3. The method of claim 1 wherein the undoped polysilicon layer is made of undoped amorphous silicon.

4. The method of claim 1 wherein the doped polysilicon layer is doped by ions of any element from group IIIA or group VA of the periodic table.

5. The method of claim 1 wherein the doped polysilicon layer is doped with phosphorus ions.

6. The method of claim 1 wherein the doped polysilicon layer is formed in-situ on the surface of the undoped polysilicon layer inside the plug-shaped recess.

* * * * *